United States Patent [19]
Turner et al.

[11] Patent Number: 5,686,793
[45] Date of Patent: *Nov. 11, 1997

[54] EXCIMER LAMP WITH HIGH PRESSURE FILL

[75] Inventors: Brian Turner, Damascus; James T. Dolan, Frederick, both of Md.

[73] Assignee: Fusion UV Systems, Inc., Gaithersburg, Md.

[*] Notice: The term of this patent shall not extend beyond the expiration date of Pat. No. 5,504,391.

[21] Appl. No.: 621,364

[22] Filed: Mar. 25, 1996

Related U.S. Application Data

[63] Continuation of Ser. No. 8,783, Jan. 27, 1993, Pat. No. 5,504,391, which is a continuation-in-part of Ser. No. 999,580, Dec. 29, 1992, abandoned, which is a continuation of Ser. No. 827,041, Jan. 29, 1992, abandoned.

[51] Int. Cl.$^6$ .............................. H01J 61/12; H01J 61/20
[52] U.S. Cl. ......................... 313/570; 313/568; 313/571; 313/572; 315/248; 315/246; 315/39; 315/344
[58] Field of Search .................................. 313/570, 568, 313/576, 572, 643, 607; 315/248, 246, 39, 344; 372/57

[56] References Cited

U.S. PATENT DOCUMENTS

| | | |
|---|---|---|
| 3,234,421 | 2/1966 | Reiling . |
| 3,911,318 | 10/1975 | Spero et al. . |
| 4,143,336 | 3/1979 | Searles et al. . |
| 4,301,425 | 11/1981 | Sze . |
| 4,397,023 | 8/1983 | Newman et al. . |
| 4,427,921 | 1/1984 | Proud . |
| 4,498,029 | 2/1985 | Yoshizawa et al. . |
| 4,513,424 | 4/1985 | Waymant et al. . |
| 4,549,109 | 10/1985 | Nighan et al. . |
| 4,646,311 | 2/1987 | Nighan et al. . |
| 4,710,679 | 12/1987 | Budinger et al. . |
| 4,710,939 | 12/1987 | Birnbach et al. . |
| 4,802,183 | 1/1989 | Harris et al. . |
| 4,890,292 | 12/1989 | Nishimae et al. . |
| 4,942,337 | 7/1990 | Beerwald et al. . |
| 4,945,290 | 7/1990 | Eliasson . |
| 4,955,035 | 9/1990 | Gekat . |
| 5,062,116 | 10/1991 | Christensen . |
| 5,293,403 | 3/1994 | Bashkansky et al. . |
| 5,504,391 | 4/1996 | Turner et al. ............................. 313/520 |

FOREIGN PATENT DOCUMENTS

| | | |
|---|---|---|
| 0168984 | 3/1990 | Japan . |
| 02241074 | 9/1990 | Japan . |
| 3-1436 | 1/1991 | Japan . |

OTHER PUBLICATIONS

Hiroshi Kumagai and Minoru Obara, "New High-Efficiency Quasi-Continuous Operation of a KrF9B (B X) Excimer Lamp Excited By Microwave Discharge" Appl. Phys. Lett., vol. 54, No. 26, 26 Jun. 1989, 1989 American Institute of Physics, pp. 2619-2621.

Hiroshi Kumagai and Minoru Obara, "Microwave Discharge-Pumped Excimer Lamp", The Review of Laser Engineering, vol. 18, No. 7, Jul. 1990, pp. 456-473.

Ulrich Kogelschatz, "Silent Discharge for the Generation of VU and VUV Excimer RAdiation", 9th International Symposium on Plasma Chemistry, Pugnochiuso, Italy, Sep. 4-8, 1989, pp. 1-8.

Keith Johnson, Roland Pease, John P. Simons and Peter A. Smith, "Competitive Channels in the Interaction of Xe(P) With $Cl^2$, $Br_2$ and $I_2$", J. Chem. Soc., Faraday Trans. 2, 1986, 82,1281-1295, pp. 1281-1295.

B. Eliasson and U. Kogelschatz, "UV Excimer Radiation from Dielectric-Barrier Discharges", Appl. Phys. B 46, pp. 299-303 (1988).

*Primary Examiner*—Nimeshkumar Patel
*Attorney, Agent, or Firm*—Shlesinger, Arkwright & Garvey LLP

[57] ABSTRACT

An excimer lamp utilizing a high pressure fill. The fill includes a halogen at an operating pressure of greater than about 350 torr or the combination of a halogen and a rare gas at a total operating pressure of greater than about 2.5 atmospheres.

10 Claims, 4 Drawing Sheets

EXCIMER LAMP WITH HIGH PRESSURE FILL

The present application is a continuation of U.S. application Ser. No. 08/008,783, filed Jan. 27, 1993, now U.S. Pat. No. 5,504,391, which is a continuation-in-part of U.S. application Ser. No. 07/999,580, now abandoned, filed Dec. 29, 1992, which is a continuation of U.S. application Ser. No. 07/827,041, now abandoned, filed Jan. 29, 1992. U.S. application Ser. No. 08/008,783 is incorporated herein by reference.

The present invention is directed to an improved excimer lamp.

In recent years, many industrial processes have been developed which use ultraviolet radiation to treat material. In some such processes, the material has a photocurable coating thereon, and the ultraviolet radiation "cures" the coating by a chemical reaction. Such photocurable coatings may for example be clear or pigmented, and are applied to a variety of objects including flat substrates and curved objects such as cans. Photocurable coatings are also used in practicing semiconductor photolithography, which is a process which is used in the manufacture of integrated circuits.

The ultraviolet lamp which is used to irradiate photocurable coatings typically utilizes a bulb fill which contains mercury, with an additive or additives sometimes being present to add emphasis to a particular region or regions of the spectrum. Thus, the spectrum of the light which is emitted by the lamp is the spectrum of the element mercury, or that of mercury plus a particular additive.

The spectrum of mercury as generated by such lamps has radiation present throughout the fairly broad spectral band of 200– 400 nanometers. Since the radiation is distributed throughout the entire band, the efficiency of the lamp in any particular narrower part of the entire band is relatively low.

For some applications, it would be desirable to have most of the radiation output of the lamp within a narrower band. By way of example, some photocurable materials are much more responsive to ultraviolet radiation within the relatively narrow 250–300 nanometer band than to radiation in other parts of the ultraviolet spectrum. Such a material would be more rapidly cured by a lamp which has most of its output concentrated within the 250–300 nanometer band.

In recent years, discharge devices which emit excimer radiation have become known. Excimers are unstable excited complexes of molecules that under normal conditions possess an unbound or weakly bound ground state, and thus are not known from classical physics. That is, the excimer complexes exist only in the excited state. The excimer complexes disintegrate within less than a microsecond, and during their decay give off their binding energy in the form of radiation in a narrow band.

While the most common excimer devices are lasers, recently a microwave powered excimer lamp has been disclosed. In the article entitled "New High-Efficiency Quasi-Continuous Operation of A KrF (B→X) Excimer Lamp Excited by Microwave Discharge" by Kumagai and Obara, Applied Physics letters, Vol. 54, No. 26, Jun. 26, 1989, pp. 2619–2621, a lamp which emits radiation in a very narrow band of several nanometers about 248 nm is discussed. The lamp utilizes a fill having small amounts of fluorine and krypton in a buffer gas mixture of helium and neon. The article teaches that it is required to operate the lamp at a low pressure to achieve suitable efficiency, with an efficiency of 12.1% being attained at a desired total pressure of 50 torr and a halogen pressure of 1 torr. This efficiency may not be high enough for certain applications.

In accordance with a broadest aspect of the present invention, an excimer lamp is provided which contains a fill which includes a halogen at a pressure which is greater than about 350 torr at operating temperature. In accordance with the invention, even better results are obtained when the halogen pressure is greater than about 750 torr during operation, and still better results are obtained when the halogen pressure is greater than about 6 atmospheres. The fill may contain a halogen or a halogen and a rare gas.

In accordance with a further aspect of the invention, an excimer lamp is provided which contains a fill which includes a rare gas and a halogen, wherein the total fill pressure is greater than about 2.5 atmospheres at operating temperature, and preferably above 10 atmospheres. In accordance with this aspect of the invention, the partial pressure of the halogen may be greater or less than 350 torr.

It is noted that substances may be added to the fill to provide spectral emphasis. For example zinc may be included in an excimer containing fill to add spectral emphasis in the 250–350 nanometer range. Furthermore, the fill may contain combinations of halogens, the combination of a rare gas and multiple halogens, multiple rare gas/halogen combinations, or a halogen and multiple rare gases. Alternatively, the fill may consist only of a halogen, or the combination of a halogen and a rare gas.

In accordance with the microwave excited embodiment of the invention, microwave energy is provided by a magnetron or other device, while the fill is contained in a suitable envelope, such as one which is made of quartz. The microwave energy is coupled to the fill by a coupling means which includes a mesh which is opaque to the microwave energy, but substantially transparent to the excimer radiation which is emitted by the fill, to enable the radiation to be directed out of the lamp.

The invention will be better understood by referring to the accompanying drawings wherein.

Figure 1:
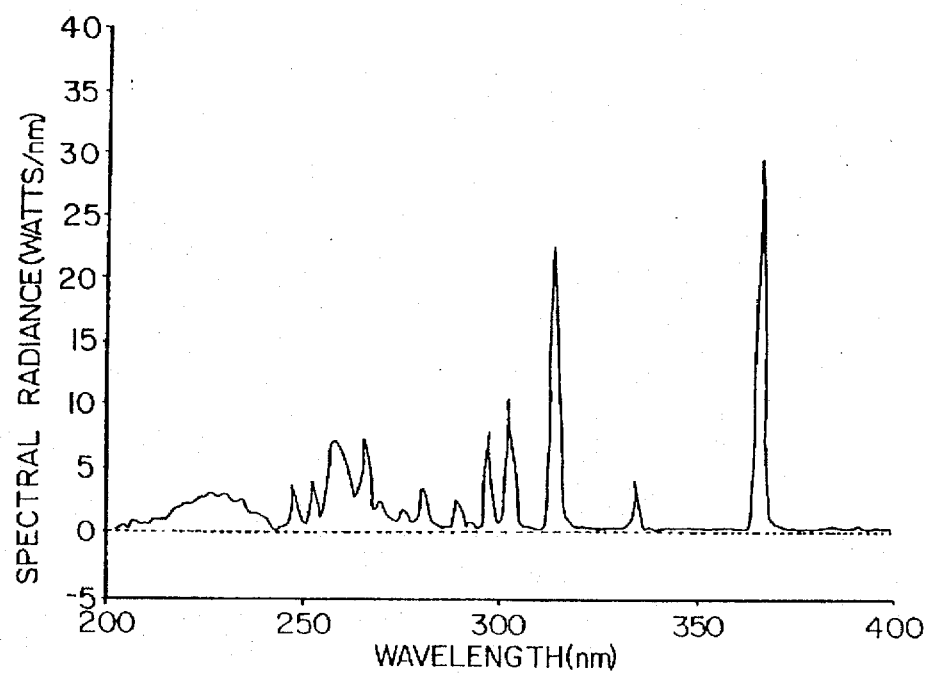
FIG. 1 is a representation of the spectrum between 200 and 400 nm which is provided by a microwave lamp having a mercury fill.

Referring to FIG. 1, the ultraviolet spectrum which is generated by a microwave powered lamp having a mercury fill is depicted. As may be seen, the ultraviolet power output of the lamp is distributed throughout the 200–400 nanometer range. As discussed above, it may be desirable to have the power concentrated in a narrower range, for if a particular photocurable substance only responds within such a narrow range, the remainder of the power is largely wasted.

A lamp in accordance with a first embodiment of the present invention is depicted in FIGS. 2 to 5. The lamp is seen to include envelope or bulb 4 which contains the excimer forming fill, magnetron 20, and coupling means for coupling the microwave energy which is generated by magnetron 20 to the bulb fill.

Figure 2:
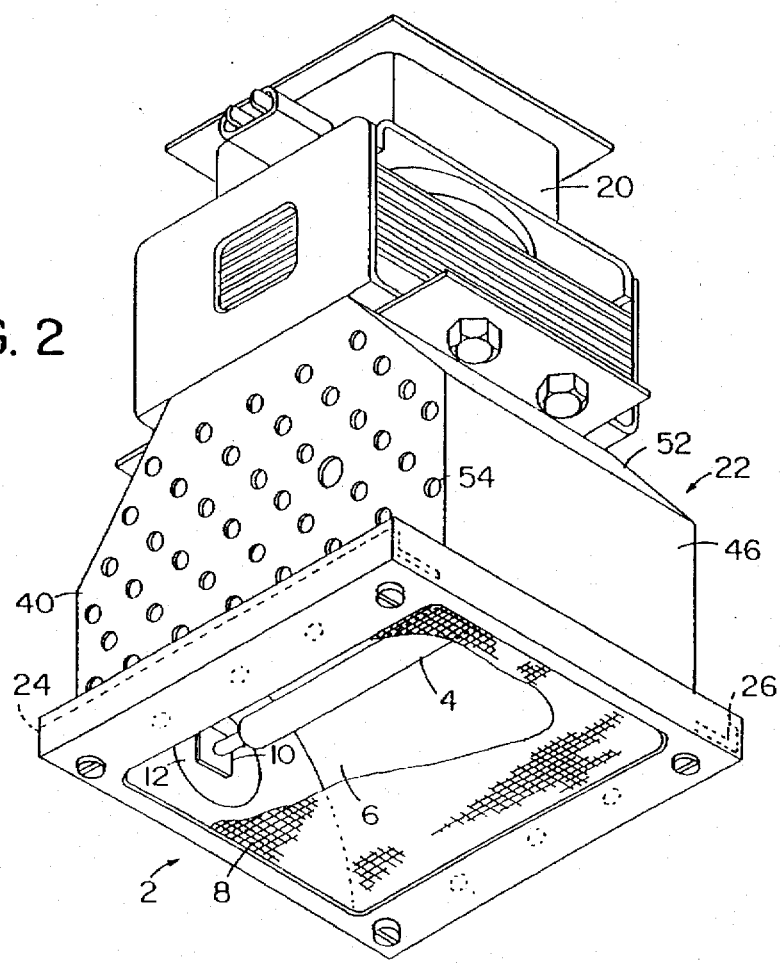
FIGS. 2 to 5 show an embodiment of the present invention which utilizes a linear bulb.

The coupling means includes microwave cavity 2 which is comprised of reflector 6 and mesh 8. As is seen in FIG. 2, the reflector 6 includes slots 16 and 18, through which microwave energy is coupled. Additionally, mesh 8 is substantially opaque to the microwave energy so as to contain it in the cavity, while being substantially transparent to the radiation which is emitted by the fill in bulb 4.

Figure 3:
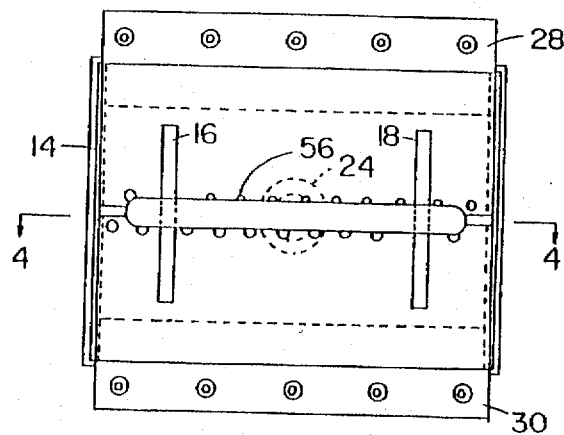
Figure 4:
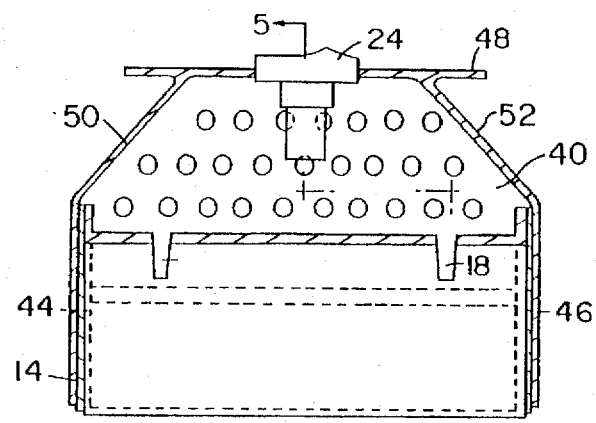
Figure 5:
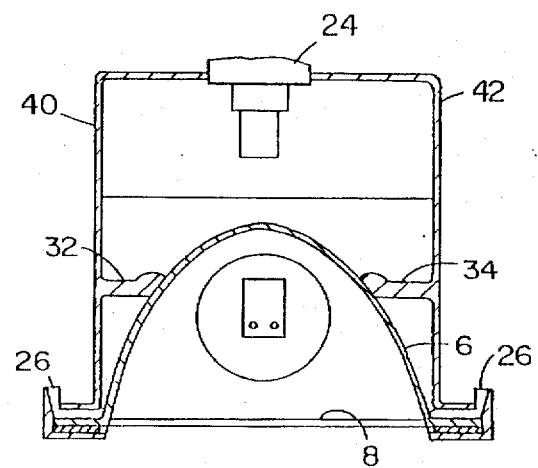

A further part of the microwave coupling means in the particular lamp illustrated in FIGS. 1 to 4 is metallic, inverted box structure 22. Referring to FIGS. 2, 4, and 5, it will be seen that the structure is comprised of sidewall member 48, and angularly disposed members 50 and 52. Structure 22 fits over reflector 6 as illustrated in FIGS. 2 and 5, and the structure in combination with the reflector forms a microwave enclosure or waveguide means for transferring microwave energy to the coupling slots. The magnetron launcher is disposed in opening 24 which is located equidistant from the chamber ends, and the launcher is thus located in the waveguide means equidistant from the coupling slots. The bottom of inverted box-like structure 22 has flanges 24 and 26 which may be secured to cooperating flanges 28 and 30 which extend from the reflector, for example by being screwed thereto.

Structure 22 may additionally have members 32 and 34 shown in FIG. 5 running along the length of the inside of sidewalls 40 and 42 and connecting these sidewalls to the reflector. Members 32 and 34 have the effect of shortening the height of the waveguide means, and providing for more efficient coupling of the microwave energy to slots 16 and 18. Additionally, the sidewalls of the waveguide means have cooling holes 54 therein and reflector 6 has cooling holes 56 along the top, as shown in FIG. 3. The lamp is cooled by pushing or pulling air or other cooling gas through the waveguide means and microwave chamber past the lamp envelope.

The frequency of the microwave energy generated by magnetron 20 and the longitudinal dimension of chamber 2 are arranged so that during operation a symmetrical standing wave exists in the microwave chamber which has a minimum or null at the middle of the chamber in the longitudinal direction. When so energized, the microwave coupling structure illustrated in FIGS. 1 to 4 couples microwave energy to envelope 4 in such manner that the envelope produces a balanced output across its length.

In accordance with a first and broadest aspect of the invention, the fill in bulb 4 includes a halogen, or the combination of a halogen and a rare gas, wherein the halogen is at a pressure of greater than about 350 torr at operating temperature. As mentioned above, better results are obtained when the halogen pressure is greater than about 750 torr, and still better results are obtained when the halogen pressure during operation is greater than about 6 atmospheres In accordance with a further aspect of the invention, in a bulb which contains a fill which includes the combination of a rare gas and a halogen, the total fill pressure is arranged to be greater than about 2.5 atmospheres at operating temperature, and preferably above 10 atmospheres, while the halogen pressure may be greater or less than 350 torr.

Ten rare gas/halogen combinations emit excimer radiation, and these are XeBr, KrBr, XeI, XeCl, KrCl, ArCl, XeF, KrF, ArF, and NeF. Additionally, the fill may include multiple halogens and a rare gas, multiple rare gases and a halogen, or multiple halogens and multiple rare gases. Additionally, it may be desirable to add substances to the fill to provide spectral emphasis in different regions of the spectrum. For example, mercury, zinc, cadmium, or some combination of them may be used as additives for this purpose.

When a lamp such as is shown in FIGS. 2 to 5 utilizes a high pressure fill in accordance with the invention as described above, excimer radiation at suitable efficiency is emitted. The radiation is reflected by reflector 6 through mesh 8 to the exterior of the lamp, where the radiation is utilized. Furthermore, in implementations which were built, it was found that within certain limits efficiency increased with fill pressure, and again within certain limits that efficiency increased with power density. The power density is arranged to be in excess of about 225 watts/cc, and preferably in excess of about 1000 watt/cc, which with suitable cooling results in an operating temperature (wall temperature) of between about 750° C. and 950°.

In a particular lamp similar to the one depicted in FIGS. 2 to 5, a fill containing a mixture of xenon and bromine was utilized. The bromine was present at a pressure of about 7.2 atmospheres while the xenon was present at about 2.5 atmospheres at operating temperature. The power input to the lamp was 1482 watts.

Figure 6:
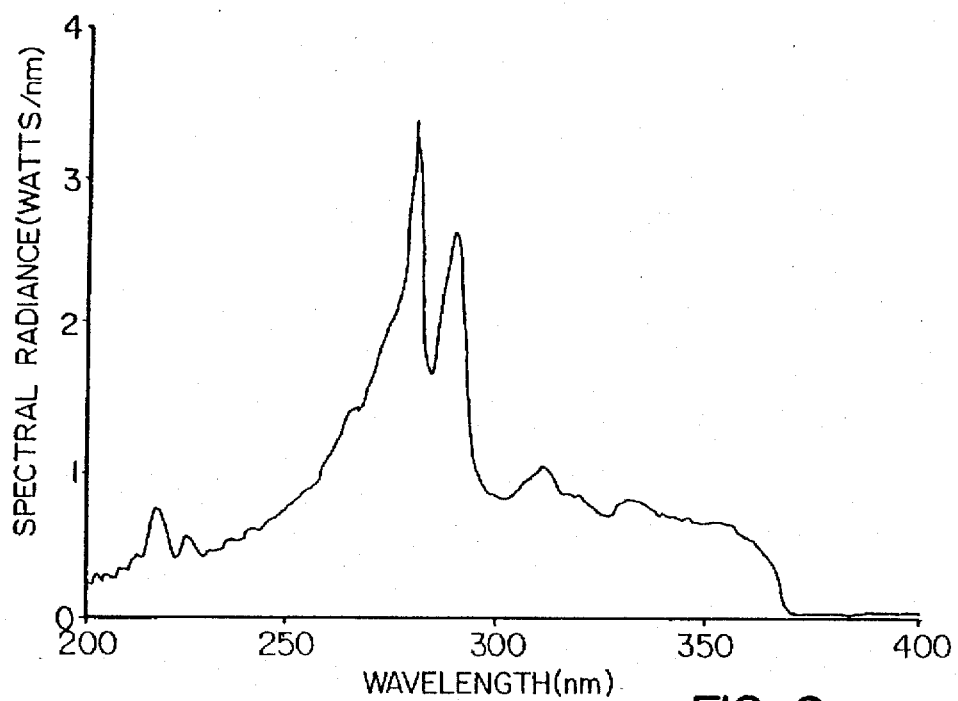
FIG. 6 is a representation of the spectral output of a lamp in accordance with an embodiment of the invention.

The spectrum which was provided by this lamp is shown in FIG. 6. It is seen that most of the radiation is concentrated over a range of about 50 nanometers (250–300 nm), in distinction to the spectrum of the mercury lamp which is shown in FIG. 1. The spectrum includes a XeBr line which is followed by a $Br_2$ line, and it should be noted that the visible spectrum (above 400 nm) is flat and without structure. It was found that the efficiency of the lamp tended to increase with increasing fill pressure.

In another case, the bulb was again filled with xenon and bromine, with the bromine pressure being about 7.2 atmospheres and the xenon pressure being about 5 atmospheres during operation. A power of 1168 watts was applied to the lamp, and the spectrum shown in FIG. 7 resulted. The efficiency of the lamp was 14.6% in the 250–300 nanometer range, which is a higher efficiency than that disclosed in the prior art Kumagai and Obara lamp discussed above.

Figure 7:
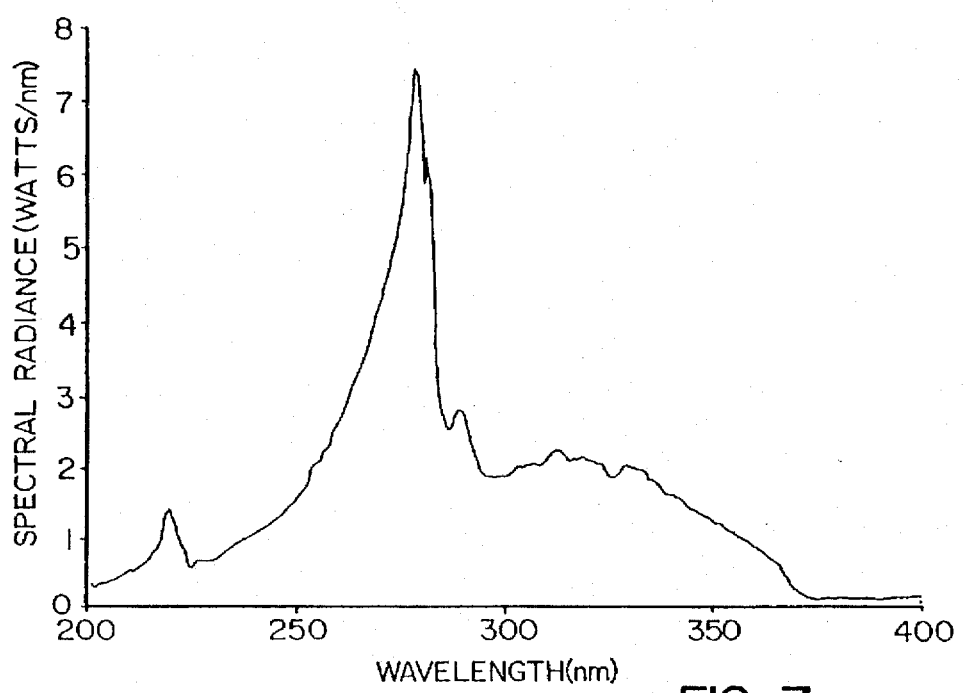
FIG. 7 is a representation of the spectral output of a lamp in accordance with another embodiment of the invention.

It should be noted that the spectra illustrated in FIGS. 6 and 7 have most of the radiation concentrated in a band of about 50 nanometers, which is a substantially broader band than in the embodiments disclosed in Kumagai and Obara. This is an important advantage for certain applications. It also should be appreciated that different specific fills can result in spectra wherein the radiation is concentrated in bands of different widths.

The procedure which was used for filling the above bulbs was to fill a manifold with a fixed pressure of liquid bromine and xenon, then using liquid nitrogen, freeze out most of the contents of the manifold into a single bulb. The nubbin was added to the end of the bulb while its contents were frozen. Of course the halogen may be added to the bulb by the use of a halide compound. The procedure to start the lamps was to spray liquid nitrogen onto the bulbs to freeze the bromine, whereupon a Tesla coil was placed near the bulb while under microwave-excitation to start the lamp.

Figure 8:
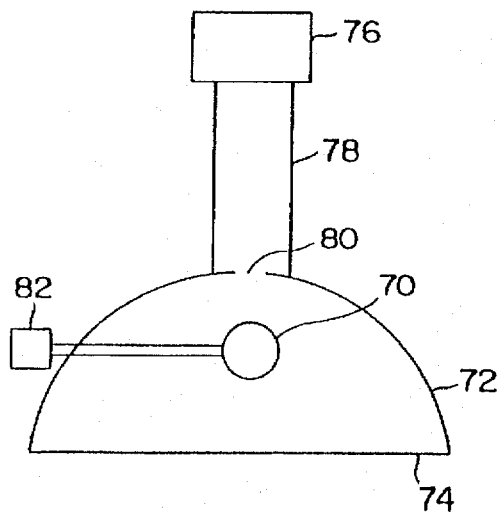
FIG. 8 shows a further embodiment of the invention, which utilizes a spherical bulb.

Referring to FIG. 8, a further embodiment of the invention which utilizes a microwave lamp which incorporates a spherical bulb is depicted. In this embodiment, bulb 70 is disposed in a microwave cavity which is comprised of reflector 72 and mesh 74. Magnetron 76 provides microwave energy, which is fed by waveguide 78 through the slot 80 in reflector 72. The ultraviolet radiation which is emitted by bulb 70 is reflected by reflector 72 through mesh 74, so as to exit the lamp. The bulb is cooled by being rotated by motor 82 while pressurized air is directed to the bulb. The lamp which is depicted in FIG. 8 may use a bulb fill as heretofore described to produce excimer radiation.

While the preferred embodiment of the fill of the present invention is in connection with a microwave powered lamp, the fill may be used to provide excimer radiation in any type of electrically excited lamp, including R.F. powered lamps and arc lamps.

Figure 9:
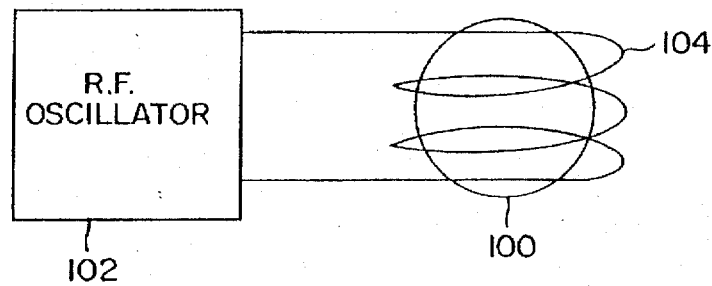
FIGS. 9 and 10 show still further embodiments of the invention.

In this regard, FIG. 9 depicts electrodeless lamp 100, having a fill as described above, which is powered by R.F. energy. Referring to the Figure, R.F. oscillator 102 provides electromagnetic energy in the R.F. range which is fed to coil 104, which is arranged to inductively couples the energy to lamp 100 at a suitably high power density. As is known to those skilled in the art, capacitive coupling may be used in lieu of inductive coupling.

Figure 10:
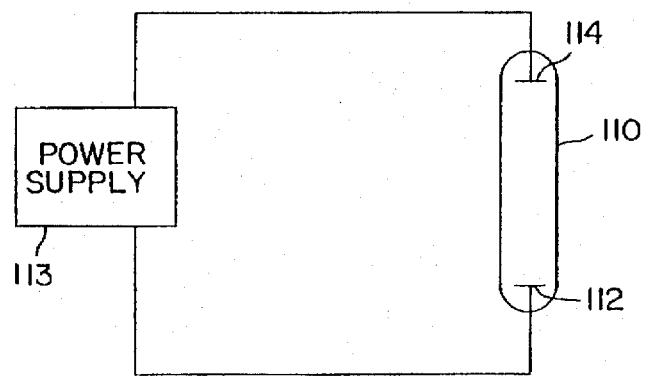

FIG. 10 depicts an arc lamp 110 having electrodes 112 and 114, which is provided with the fill of the present invention. Arc lamp power supply 112 couples electrical energy to the lamp, so as to provide excimer radiation.

An improved lamp for providing excimer radiation has thus been disclosed. It should be appreciated that while the invention has been disclosed in connection with illustrative embodiments, variations will occur to those skilled in the art, and the scope of the invention is to be limited only by the claims appended hereto as well as equivalents.

We claim:

1. A microwave powered electrodeless lamp, comprising, microwave energy generating means, a microwave cavity, an envelope containing substance which emits excimer radiation upon excitation disposed in said microwave cavity, said substance comprising halogen in an amount sufficient to result in a halogen pressure of greater than about 350 torr at operating temperature, and means for coupling microwave energy produced by said microwave energy generating means to said cavity to cause said substance to emit excimer radiation.

2. The lamp of claim 1 wherein said substance which emits excimer radiation consists essentially of halogen.

3. The lamp of claim 1 wherein said substance which emits excimer radiation consists essentially of halogen and rare gas.

4. The lamp of claims 2 or 3 wherein the amount of halogen is such to result in a halogen pressure of greater than about 750 torr at operating temperature.

5. The lamp of claims 2 or 3 wherein the amount of halogen is such to result in a halogen pressure of greater than about 6 atmospheres at operating temperature.

6. The lamp of claim 5 wherein said halogen is chlorine.

7. The lamp of claim 3 wherein said halogen is bromine and said rare gas is xenon.

8. An electrodeless lamp bulb, comprising, an envelope which does not include exterior electrodes thereon, and substance in said envelope which emits excimer radiation when excited, said substance consisting essentially of halogen in an amount sufficient to result in a halogen pressure of greater than about 350 torr at operating temperature.

9. An electrodeless lamp bulb, comprising, an envelope which does not include exterior electrodes thereon, and substance in said envelope which emits excimer radiation when excited, said substance consisting essentially of rare gas and halogen wherein the halogen is present in an amount sufficient to result in a halogen pressure of greater than about 350 torr at operating temperature.

10. The bulb of claim 8 or 9 wherein the halogen is present in an amount sufficient to result in a halogen pressure of greater than about 6 atmospheres at operating temperature.

* * * * *